United States Patent [19]
Lewicki et al.

[11] Patent Number: 5,847,607
[45] Date of Patent: Dec. 8, 1998

[54] HIGH SPEED FULLY DIFFERENTIAL OPERATIONAL AMPLIFIER WITH FAST SETTLING TIME FOR SWITCHED CAPACITOR APPLICATIONS

[75] Inventors: Laurence D. Lewicki; Ion E. Opris, both of Sunnyvale, Calif.

[73] Assignee: National Semiconductor Corporation, Santa Clara, Calif.

[21] Appl. No.: 772,011

[22] Filed: Dec. 19, 1996

[51] Int. Cl.⁶ .................................. H03F 3/45; H03F 1/14
[52] U.S. Cl. ........................... 330/258; 330/292; 330/300
[58] Field of Search ................................... 330/253, 258, 330/259, 292, 300

[56] References Cited

U.S. PATENT DOCUMENTS 4,714,895  12/1987  Nicollini et al. ......................... 330/258
5,420,539   5/1995  Fensch .................................... 330/253

OTHER PUBLICATIONS

A 10–b 20 Msample / s Analog–to–Digital Converter, Stephen H. Lewis et al., IEEE Journal of Solid–State Circuits, vol. 27, No. 3, Mar. 1992, pp. 351–358.

A Fast–Settling CMOS Op Amp for SC Circuits with 90–dB DC Gain, Klaas Bult et al., IEEE Journal of Solid–State Circuits, vol. 25, No. 6, Dec. 1990, pp. 1379–1384.

A Fully Differential Sample–and–Hold Circuit for High–Speed Application, Germano Nicollini et al., IEEE Journal of Solid–State Circuits, vol. 24, No. 5, Oct. 1989, pp. 1461–1465.

A High–Swing, High–Impedance NOS Cascode Circuit, Eduard Säckinger et al., IEEE Journal of Solid–State Circuits, vol. 25, No. 1, Feb. 1990, pp. 289–298.

MOS Operational Amplifier Design—A Tutorial Overview, Paul R. Gray et al., IEEE Journal of Solid–State Circuits, vol. SC–17, No. 6, Dec. 1982, pp. 969–982.

*Primary Examiner*—Steven Mottola
*Attorney, Agent, or Firm*—Limbach & Limbach L.L.P.; Steven M. Santisi

[57] ABSTRACT

A high speed fully differential operational amplifier with fast settling time for switched capacitor applications includes a high gain active cascode applied to the operational amplifier's input stage transistors to improve the gain, provide a higher output impedance, and thus, reduce the Miller feedback gate drain capacitance of the input stage devices. This improves the speed of the amplifier. A biasing technique is used to keep the active cascodes biased during transient overload so that settling will not be adversely affected during the recovery of the cascodes. A pair of transistors are used to feed forward a fraction of the tail current to "keep-alive" the cascode transistors. In other words, the fraction of the tail current that is fed to the source of the cascode transistors via the keep-alive transistors effectively biases the active cascodes sufficiently so that they do not turn off completely during slewing.

31 Claims, 13 Drawing Sheets

HIGH SPEED FULLY DIFFERENTIAL OPERATIONAL AMPLIFIER WITH FAST SETTLING TIME FOR SWITCHED CAPACITOR APPLICATIONS

TECHNICAL FIELD

This invention relates to high speed fully differential operational amplifiers suitable for switched capacitor applications. More particularly, this invention relates to an operational amplifier that has its input stage transistors in an active cascode configuration to improve the gain and reduce the Miller feedback gate drain capacitance and a biasing circuit to keep the cascodes biased during transient overload so that settling will not be adversely affected during the recovery of the cascodes.

BACKGROUND ART

Settling time is the amount of time, following application of a step input, that is required for the output voltage to settle to within a specified percentage of its desired final value. For example, the settling time is a measure of the time period for which an operational amplifier does not provide an accurate output, following a rapid signal change. In practice, settling time is commonly specified as the time required for a response to settle to within 0.1 or 0.01 percent of final value. Alternatively, settling time can be expressed as the time required to settle to within $2^{-x}$ error range from the final value. Using this notation, settling time is commonly said to settle to X bits within a specified number of seconds.

In order to achieve short settling times, folded cascode operational amplifiers have been used extensively. For examples of such amplifiers see Gray and Meyer, "MOS Operational Amplifier Design—A Tutorial Overview", *IEEE J. Solid State Circuits*, vol. SC-17 no. 6, pp. 969–982, December 1982, which is incorporated herein by reference. An example of a typical folded cascode amplifier from Gray and Meyer is shown in FIG. 1.

Referring to FIG. 1, transistors 10 and 12 form the input differential pair. The output currents are folded up through the cascode transistors 14 and 16. The two outputs are sensed by the common mode feedback amplifier 18 and this information is used to drive the gates of transistors 20 and 22 so that the outputs $V_{out-}$ and $V_{out+}$ of the amplifier are centered around Vmid (nominally Vmid is at the center of the two power supply voltages, Vdd and Vss.) Transistors 24, 26, 28, 30, and 32 are current sources.

The folded cascode amplifier has two poles—to a first order the gain-bandwidth product is set by the load capacitance and the input stage transconductance. Equation 1 expresses this relationship.

$$GBW = \frac{gm_{10}}{2 \cdot \pi \cdot C_{LOAD}} \quad (1)$$

This means that for large bandwidths, a large transconductance is required and hence a large P-channel device is required. This has negative implications on the settling time of the operational amplifier in two ways. First large p-channel devices have large drain-bulk junction capacitances. These larger junction capacitances reduce the frequency of the non-dominant pole of the amplifier. Equation 2 expresses the inverse relationship between the junction capacitance and the frequency of the non-dominant pole.

$$pole_2 \cong -\frac{gm_{14}}{2 \cdot \pi \cdot (C_{GS5} + C_{DB1} + C_{DB3})} \quad (2)$$

Ideally, operational amplifiers used in analog-to-digital converters will have smooth exponential settling dominated by a single pole. For this to happen, it is required that the non-dominant pole be at a much higher frequency than the gain-bandwidth product of the amplifier. In a folded cascode amplifier with a high transconductance PMOS input stage as depicted in the typical amplifier of FIG. 1, it is not unusual that the drain-bulk capacitance of transistor 10 will become as large or larger than the gate-source capacitance of transistor 14. This causes the frequency of the non-dominant pole, and thus the phase margin, to be reduced and the settling performance of the amplifier degraded.

The settling time is also related to the manner in which the operational amplifier is connected when calculating the residues in the pipelined analog-to-digital converter. FIG. 2 shows the residue computation circuit.

This circuit operates in a straight forward manner. During a first phase of the non-overlapping clocks, switch $S_{1c}$ holds the operational amp 34 as a follower. The operational amplifier 34 samples ground and the input voltage ($Vres_{i-1}$) minus the operational amplifier offset is sampled on two capacitors C1 and C2 through switches $S_{1a}$ and $S_{1b}$, respectively. During a second phase of the non-overlapping clocks, the bottom plate of the capacitor C1 is connected to the operational amplifier output through switch $S_{2b}$, and the other capacitor C2 has its bottom plate connected to $D_i^*$Vref. Equation 3 describes this relationship.

$$Vres_i = (2 \cdot Vres_{i-1} - D_i \cdot Vref) \cdot (1 - \epsilon_i) + Vofs_i \quad (3)$$

Where $\epsilon_i$ represents an error due to finite operational amplifier gain and settling and $Vofs_i$ represents the total offset due to the sum of charge injection effects and operational amplifier offset.

The closed loop bandwidth of the circuit is related to the open loop bandwidth of the amplifier by Equation 4 below where $C_{in}$ is the input capacitance of the operational amplifier.

$$GBW_{cl} = GBW_{ol} \cdot \left( \frac{C}{2 \cdot C + C_{in}} \right) \quad (4)$$

In typical applications, C=0.7pF. In order to keep $C_{in}$<0.6pF, the size of the input PMOS must be limited to about 600 $\mu$m/.8 $\mu$m which translates to a transconductance of about 3.5mA/V. With a 2pF load this means the bandwidth of the amplifier is limited to 278MHz and the bandwidth of the residue computation stage is even lower at about 139MHz. With slewing, the settling time is limited to about 20ns.

Inverting the amplifier does not improve the settling time. The PMOS $f_t$ problem is merely moved to the cascode and this in turn limits the non-dominant pole frequency, which degrades the phase margin of the amplifier and thereby limits the settling speed of the operational amplifier.

Another problem with the basic folded cascode operational amplifier of FIG. 1 is the amount of power dissipated. While the amplifier is slewing, all of the current in transistor 24 flows through either input transistor 10 or 11. When this happens, transistor 20 (or 22) must be conducting enough current so that the cascode node does not collapse (i.e. so that transistor 20 does not enter the triode region of operation). Typically, transistor 20 is biased to conduct 20% more current than transistor 24. Therefore, nominally, the amplifier requires 2.4 times the tail current to function properly.

Another problem with the typical folded cascode amplifier of FIG. 1 is that there are three non-correlated noise sources. Random noise is contributed by the input pair 10 and 12, the transistors 20 and 22 pair, and the transistors 26 and 30 pair. This noise is referred back through the input pair 10 and 12 as shown in Equation 5. Note also that transistor 20 is running at 2.4 times the current density of transistor 10, so the transconductance of transistor 20 will be naturally higher. This will increase the input referred noise of the amplifier.

$$v_{eq} = \sqrt{v_{10}^2 + \left(\frac{gm_{20}}{gm_{10}} \cdot v_{20}\right)^2 + \left(\frac{gm_{26}}{gm_{10}} \cdot v_{26}\right)^2} \quad (5)$$

Another subtle problem relates to the Miller effect loading with respect to the input stage of the amplifier. FIG. 3 shows a small signal model for the folded cascode amplifier. The dc transfer functions from Vin to V1 and V2 are shown below in Equation 6.

$$\frac{V_1}{V_{in}} = -\frac{gm_{10} \cdot R_1 \cdot \left(1 + \frac{R_2}{R_{LOAD}}\right)}{1 + \frac{1}{R_{LOAD}} \cdot ((gm_{14} \cdot R_1 + 1) \cdot R_2 + R_1)} \quad (6)$$

$$\frac{V_2}{V_{in}} = -\frac{gm_1 \cdot R_1 \cdot (gm_{14} \cdot R_2 + 1)}{1 + \frac{1}{R_{LOAD}} \cdot ((gm_{14} \cdot R_1 + 1) \cdot R_2 + R_1)} \quad (7)$$

Some typical values are shown in Equation group 8.

$$gm_{10} = 3.5 \times 10^{-3} \quad gm_{14} = 13.7 \times 10^{-3} \quad (8)$$

$$R_1 = 3.5 \text{ K}\Omega \quad R_2 = 9.1 \text{ K}\Omega \quad R_{Load} = 600 \text{ K}\Omega$$

$$\frac{V_1}{V_{in}} = 17.0dB \quad \frac{V_2}{V_{in}} = 58.9dB$$

Analysis of these numbers indicates a number of additional problems. Most obviously, the open loop gain of this amplifier is not sufficient for a 12 bit digital-to-analog converter application. The gain is too low by almost 30dB. In addition, the speed is not sufficient. Also, because the gain to node V1 is 17dB, the Miller capacitance is multiplied by 8 times (20fF will be multiplied to 0.16pF) which is a significant percentage when compared to the 0.6pF input capacitance of the input pair 10 and 12.

To summarize, the folded cascode operational amplifier has seven inherent limitations. First, the signal path requires both p and n channels. This means low PMOS $f_t$s will limit the bandwidth. Second, P channels at the input need to be large for a large transconductance. Large devices have a large gate and Miller capacitance that loads a switched capacitor feedback network lowering the closed loop gain-bandwidth product Third, if P channels were to be used for the cascode, the lower $f_t$ of the PMOS would degrade the phase margin and settling performance of the operational amplifier. Fourth, there are three non-correlated noise sources. Fifth, the power supply needs to deliver 2.4 times the tail current to bias the amplifier. Sixth, the gain is limited because there are two devices effectively in parallel at the V1 node of the amplifier. Seventh, there is significant Miller multiplication of the gate-drain overlap capacitance at the input of the operational amplifier. This loads the capacitive feedback network and slows the open loop response of the amplifier.

Nicollini and Senderowicz have suggested an operational amplifier design that addresses the first six of the seven problems listed above but introduces an eighth problem. See Nicollini, Confalonieri, and Senderowicz, "A fully differential sample-and-hold circuit for high speed applications", *IEEE J. Solid State Circuits*, vol. SC-24 no. 6, pp. 1461–1465, December 1989 and U.S. Pat. No. 4,714,895 to Nicollini and Senderowicz, which are both incorporated herein by reference. The Nicollini et al. design is shown in FIG. 4.

While this design does address the first six of the seven problems listed above, the seventh problem actually becomes significantly worse and an eighth problem related to settling time is introduced. Referring to FIG. 4, transistors 36 and 38 form the input stage which is cascoded by transistors 40 and 42 to provide a higher output impedance and gain. Two cascoded p-channel current sources formed by transistors 44 and 46 and transistors 48 and 50, are used to bias the output. Common-mode bias is provided via a switched capacitor network formed by capacitors 52 and 54 and switches 56 and 58 on one side of the circuit and capacitors 60 and 62 and switches 64 and 66 on the other side. The tail current transistor 68 is connected between the connected sources of the differential input pair 36 and 38 and ground.

The residue computation network, which includes a switch network to allow separate input and output common mode voltages, is shown in FIG. 5. The small signal model shown in FIG. 6 for this amplifier is basically the same as for the folded cascode amplifier but with three important differences. First, there are less devices at node V1 so that resistance R1 is increased. Second, there is less current in the output stage so resistance $R_{Load}$ is also increased. Finally, transistor 36 of FIG. 4 is an NMOS device so the transconductance is higher for the same gate area and capacitance. Referring again to FIG. 6, the small signal response can be calculated using Equations 9 and 10.

$$\frac{V_1}{V_{in}} = -\frac{gm_{36} \cdot R_1 \cdot \left(1 + \frac{R_2}{R_{LOAD}}\right)}{1 + \frac{1}{R_{LOAD}} \cdot ((gm_{40} \cdot R_1 + 1) \cdot R_2 + R_1)} \quad (9)$$

$$\frac{V_2}{V_{in}} = -\frac{gm_{36} \cdot R_1 \cdot (gm_{40} \cdot R_2 + 1)}{1 + \frac{1}{R_{LOAD}} \cdot ((gm_{40} \cdot R_1 + 1) \cdot R_2 + R_1)} \quad (10)$$

Some typical values are shown in Equation group 11.

$$gm_{36} = 9.5 \times 10^{-3} \quad gm_{40} = 9.8 \times 10^{-3} \quad (11)$$

$$R_1 = 9.4 \text{ K}\Omega \quad R_2 = 12.7 \text{ K}\Omega \quad R_{Load} = 840 \text{ K}\Omega$$

$$\frac{V_1}{V_{in}} = 31.5dB \quad \frac{V_2}{V_{in}} = 73.3dB$$

Thus, the Nicollini et al. design shows a gain increase of 24dB with the same slew rate while at the same time requiring only 42% of the supply current of the folded cascode. The penalty is that a different common-mode bias point is required for the input and output stage. Much of this gain increase (8.7dB) is due to the increase in $gm_{36}$. Other factors that increase the gain are the larger values of resistance R1 and the load impedance. The input referred noise is shown in Equation 12. Note the reduction in referred noise as compared to that calculated in Equation 5 which shows the referred noise of the typical folded cascode circuit of FIG. 1.

$$V_{eq} = \sqrt{v_{36}^2 + \left(\frac{gm_{44}}{gm_{36}} \cdot v_{44}\right)^2} \quad (12)$$

While compared to the folded cascode circuit, this circuit addresses the insufficient gain problem to some degree, this amplifier does not have sufficient gain for use in a 12 bit analog-to-digital converter (ADC). A typical ADC requires an operational amplifier that has a gain of more than 85dB. This additional gain requirement can be met with some cost in signal swing and dynamic range by adding a triple cascode. This technique has been disclosed in Lewis, Fetterman, Gross, Ramachandran and Viswanthan, "A 10-b 20-Msample/s Analog-to-Digital Converter", *IEEE J. Solid State Circuits*, vol. SC-27 no. 3, pp. 351–358, March 1992 which is incorporated herein by reference.

However, the seventh problem listed above still remains. There is a large amount of gain to node V1 which Miller multiplies the Cgd capacitance by 30 times. A 20fF Cgd will effectively be 0.6pF. This is the same size as the gate capacitance. Note that adding the triple cascode of Lewis et al. does not affect the Miller multiplication. In the application shown in FIG. 2 for example, assuming C1 and C2 are both 0.7pF and Cin=Cgs+$C_{Miller}$ where $C_{Miller}$ is also 0.6pF, it can be seen that the gain bandwidth product is decreased by 25% due to the Miller capacitance. A large increase in amplifier power would be required to make up for this bandwidth attenuation.

Finally, although perhaps not evident from the above calculations, there is a new problem introduced by the Nicollini circuit of FIG. 4 related to this operational amplifier's required settling time. The settling time problem occurs due to non-linear settling of the operational amplifiers. If there is a difference in clock duty cycle, caused perhaps by power supply noise, then a the combination of nonlinear settling and moving clock edges can cause gross errors in the voltages that are sampled and subsequently processed by the next stage of the quantizer. This effect is shown in FIG. 10. Even though both waveforms settle to within the prescribed tolerance by $t_2$, if the sampling instant for the next stage of the quantizer varies slightly to $t_1$, then the ringing waveform will cause an error to be sampled by the next stage of the analog to digital converter quantizer.

Referring to FIG. 4, the ringing and/or overshoot is caused when one of the cascode transistors, 40 or 42, is turned completely off during slewing. During slewing one of the input devices, 36 or 38, is turned off (depending on whether positive or negative slewing is being considered) and subsequently the cascode device 40 or 42 in series with that input transistor 36 or 38 is also turned off. During the time period that the cascode device 40 or 42 is turned off, the amplifier is effectively running open loop. While the open loop operating condition exists, the output of the amplifier is no longer under control of the negative feedback loop and it will overshoot until the bias for the cascode devices 40 and 42 recovers and negative feedback is reapplied. Effectively, during the short period of time that the amplifier is running open loop, the circuit acts as a relaxation oscillator and will subsequently exhibit transient instability until the operational amplifier loop gain is re-established and negative feedback is reapplied to the circuit.

With regards to using the Nicollini et al. operational amplifier in a pipelined ADC application, there is one other minor problem with the common mode feedback network. As shown in FIG. 4, the common mode feedback circuit requires four capacitors—two switched capacitors and two continuously connected capacitors. For a pipelined analog-to-digital converter application, the output is required to be active only for half of the clock period. Referring to FIGS. 2 and 5, the output is sampled by the next stage when the $S_1$ switches are opened and when the $S_2$ switches are closed. The effect of the continuously connected capacitors 54 and 60 in FIG. 4 is to load the amplifier causing a speed degradation.

Thus, to summarize, the main problems with existing operational amplifier designs are that (1) the gain is too low, (2) the Cgd gets Miller multiplied by about 30 loading the capacitive feedback network and in this way decreasing the closed loop bandwidth, and (3) the settling times are too long. What is needed is an operational amplifier that can provide both adequate gain and bandwidth while at the same time provide a sufficiently short settling time for use with a 12 bit ADC.

The gain and bandwidth deficiency problems are overcome using an active feedback cascode to increase the gain and decrease the Miller multiplication. This solution is an extension of the circuit proposed in Sackinger and Guggenbuhl, "A high-swing, high-impedance MOS cascode circuit", *IEEE J. Solid State Circuits*, vol. SC-25 no. 1, pp. 289–298, February 1990, which is incorporated herein by reference. This is accomplished with only a small (i.e. <10%) increase in overall power. The new amplifier is depicted in FIG. 7.

Transistor 70 together with resistor 72 and transistors 74 and 76 forms a degenerated common-emitter amplifier that increases the voltage gain of the amplifier by multiplying the transconductance of transistor 86 by almost 50 times. Likewise, on the other side of the circuit, transistor 78 together with resistor 80, and transistors 82 and 84, forms a degenerated common-emitter amplifier that has the same effect of multiplying the transconductance of transistor 88. The concept of the active gain multiplied cascode has been disclosed in Sackinger and Guggenbuhl, "A high-swing, high-impedance MOS cascode circuit", *IEEE J. Solid State Circuits*, vol. SC-25 no. 1, pp. 289–298, February 1990, and in Bult and Geelen, "A Fast-Settling CMOS Op Amp for SC Circuits with 90-dB DC Gain", *IEEE J. Solid State Circuits*, vol. SC-25 no. 6, pp. 1379–1384, December 1990, which are both incorporated herein by reference. The small signal model of this amplifier is shown in FIG. 8. The relationships are shown below in Equations 13 and 14.

$$\frac{V_1}{V_{in}} = -\frac{gm_{90} \cdot R_1 \cdot \left(1 + \frac{R_2}{R_{LOAD}}\right)}{1 + \frac{1}{R_{LOAD}} \cdot ((gm_{86} \cdot (gm_{70} \cdot R0_{70} + 1) \cdot R_1 + 1) \cdot R_2 + R_1)} \quad (13)$$

$$\frac{V_2}{V_{in}} = -\frac{gm_{90} \cdot R_1 \cdot ((gm_{70} \cdot R0_{70} + 1) \cdot gm_{86} \cdot R_2 + 1)}{1 + \frac{1}{R_{LOAD}} \cdot ((gm_{86} \cdot (gm_{70} \cdot R0_{70} + 1) \cdot R_1 + 1) \cdot R_2 + R_1)} \quad (14)$$

Some typical values are shown below in Equation group 15.

$$gm_{90} = 9.5 \times 10^{-3} \quad gm_{86} = 9.8 \times 10^{-3} \quad (15)$$

$$R_1 = 9.4 \text{ K}\Omega \| 80 \text{ K}\Omega \quad R_2 = 12.7 \text{ K}\Omega \quad R_{Load} = 9.5 \text{ K}\Omega$$

$$gm_{70} \cdot R0_{70} = 50$$

-continued $$\frac{V_1}{V_{in}} = 21.6dB \quad \frac{V_2}{V_{in}} = 97.7dB$$

The difference between the gain to V1 and the gain to V2 is 76.1 dB. This is much higher than the difference in the Nicollini et al. amplifier as shown in Equation 11 where the difference was only 41.8dB. Compared to the typical folded cascode operational amplifier of FIG. 1, where the difference was only 41.9dB, this difference is also much higher. This higher efficiency is due to the active cascode circuit that effectively multiplies the transconductance of $gm_{86}$ by 51 times. The input referred noise of the circuit of FIG. 7 is calculated in Equation 16 and is equivalent to that of the Nicollini et al. amplifier of FIG. 4.

$$V_{eq} = \sqrt{v_{90}^2 + \left(\frac{gm_{87}}{gm_{90}} \cdot v_{87}\right)^2} \quad (16)$$

This amplifier can also be implemented with an NMOS device for the active cascode gain. This CMOS-only configuration is shown in FIG. 9.

Thus, the gain and bandwidth problems have been solved in the prior art. However, the settling time problem caused by the prior art gain solution has not been addressed. What is further needed is a high gain, wide bandwidth operational amplifier that settles quickly at high resolution.

SUMMARY OF THE INVENTION

The present invention is a high speed operational amplifier design for applications involving step input signals, such as switched capacitor applications, that provides high gain and fast settling at high resolution. The operational amplifier of the present invention provides high gain and wide bandwidth using an active cascode technique applied to the input stage transistors and a cascode biasing technique. The cascode biasing technique keeps the active cascodes biased during transient overload so that settling will not be adversely affected during the recovery of the cascodes. The biasing technique applies a specific fraction of the tail current directly to the source of the cascode transistors to keep them biased during slewing. Keeping the active cascodes biased allows the use of active cascodes in step signal applications, which not only improve the gain, but more importantly reduces the Miller feedback gate drain capacitance of the input stage devices and, thereby, improves the speed of the amplifier.

An apparatus including a differential amplifier with reduced switched output signal settling time in accordance with one embodiment of the present invention includes a cascode differential amplifier configured to receive a first and a second input bias currents and a differential input signal. It is also configured to provide a first, a second and a third output bias currents and a differential output signal. The sum of the first and second input bias currents equals the sum of the first, second and third output bias currents. The cascode differential amplifier comprises two cascode amplifiers.

The first cascode amplifier includes a first input transistor configured to receive a first phase of the differential input signal. It also provides a first portion of the third output bias current. The first cascode amplifier also includes a first output transistor cascode coupled to the first input transistor and configured to both receive the first input bias current and provide the first output bias current and a first phase of the differential output signal.

The second cascode amplifier, which includes a second input transistor configured to receive a second phase of the differential input signal, provides a second portion of the third output bias current. The second cascode amplifier also includes a second output transistor cascode coupled to the second input transistor. The second output transistor cascode is configured to receive the second input bias current, and provide both the second output bias current and a second phase of the differential output signal.

The apparatus also includes three bias transistors. The first bias transistor is coupled to the first output transistor and configured to receive and conduct the first output bias current. The second bias transistor is coupled to the second output transistor and configured to receive and conduct the second output bias current. Finally, the third bias transistor is coupled to the first and second input transistors and configured to receive and conduct the third output bias current. The first and second portions of the third output bias current vary between zero and respective first and second maximum currents in accordance with the first and second phases of the differential input signal. Additionally, the first and second output bias currents are respective first and second nonzero currents.

An apparatus including a differential amplifier with reduced switched output signal settling time in accordance with a second embodiment of the present invention additionally includes two feedback transistors. The first feedback transistor is coupled to the first bias transistor and the first input and output transistors. The first feedback transistor is configured to provide active feedback to the first output transistor. The second feedback transistor is coupled to the second bias transistor and the second input and output transistors. The second feedback transistor is configured to provide active feedback to said second output transistor.

An apparatus including a differential amplifier with reduced switched output signal settling time in accordance with a third embodiment of the present invention includes the apparatus of the first and second embodiments implemented in BiCMOS.

These and other features and advantages, of the present invention will be understood upon consideration of the following detailed description of the invention and the accompanying drawings.

DETAILED DESCRIPTION OF THE PREFERRED EMBODIMENTS

Figure 11:
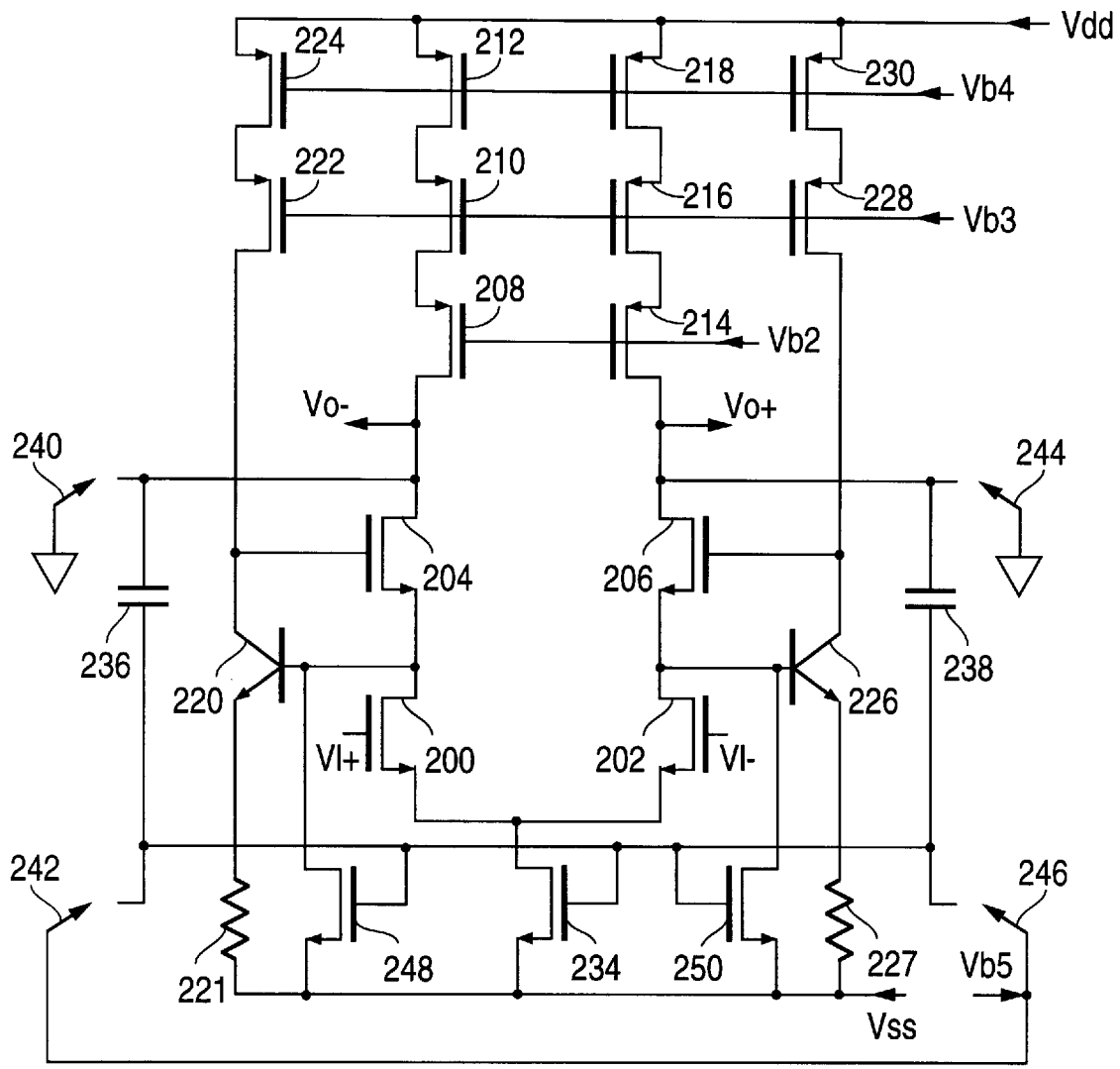
FIG. 11 depicts a BiCMOS operational amplifier, with low input Miller capacitance and low overshoot transient response, according to the present invention.

Turning now to FIG. 11, a BiCMOS preferred embodiment of the operational amplifier of the present invention will be described in detail. The gates of transistors 200 and 202 are the differential pair inputs. The sources of transistors 200 and 202 are connected to each other and they feed the drain of the tail current transistor 234. The source of the tail current transistor 234 is connected to ground. The gate of the tail current transistor 234 is connected to a node which also connects two switched capacitor networks 236, 240, 242 and 238, 244, 246 as well as the gates of "keep-alive" transistors 248 and 250. "Keep-alive" refers to the transistors 248 and 250 feeding forward a small fraction of the tail current to "keep-alive" or bias the folded cascode transistors 204 and 206 with enough current so that they will not turn off during transient slewing. Thus, the sources of keep-alive transistors 248 and 250 are connected to ground while the drains are connected to the sources of cascode transistors 204 and 206, respectively. The sources of cascode transistors 204 and 206 are connected to the drains of the input transistors 200 and 202, respectively. The drains of the cascode transistors 204 and 206 are the output nodes of the operational amplifier. Also connected to the output nodes are the telescoped current sources formed by three cascoded P-channel transistors 208, 210, 212 on the negative output side of the circuit and three cascoded P-channel transistors 214, 216, 218 on the positive output side of the circuit.

Finally, this first preferred embodiment of the present invention includes degenerated common-emitter amplifiers formed by amplifier transistor 220 together with resistor 221, and transistors 222 and 224 on one side of the circuit and by amplifier transistor 226 together with resistor 227, and transistors 228 and 230 on the other side. The bases of the amplifier transistors 220 and 226 are connected to the sources of the cascode transistors 204 and 206, respectively, and the emitters of the amplifier transistors 220 and 226 are connected to the gates of the cascode transistors 204 and 206, respectively.

Figure 7:
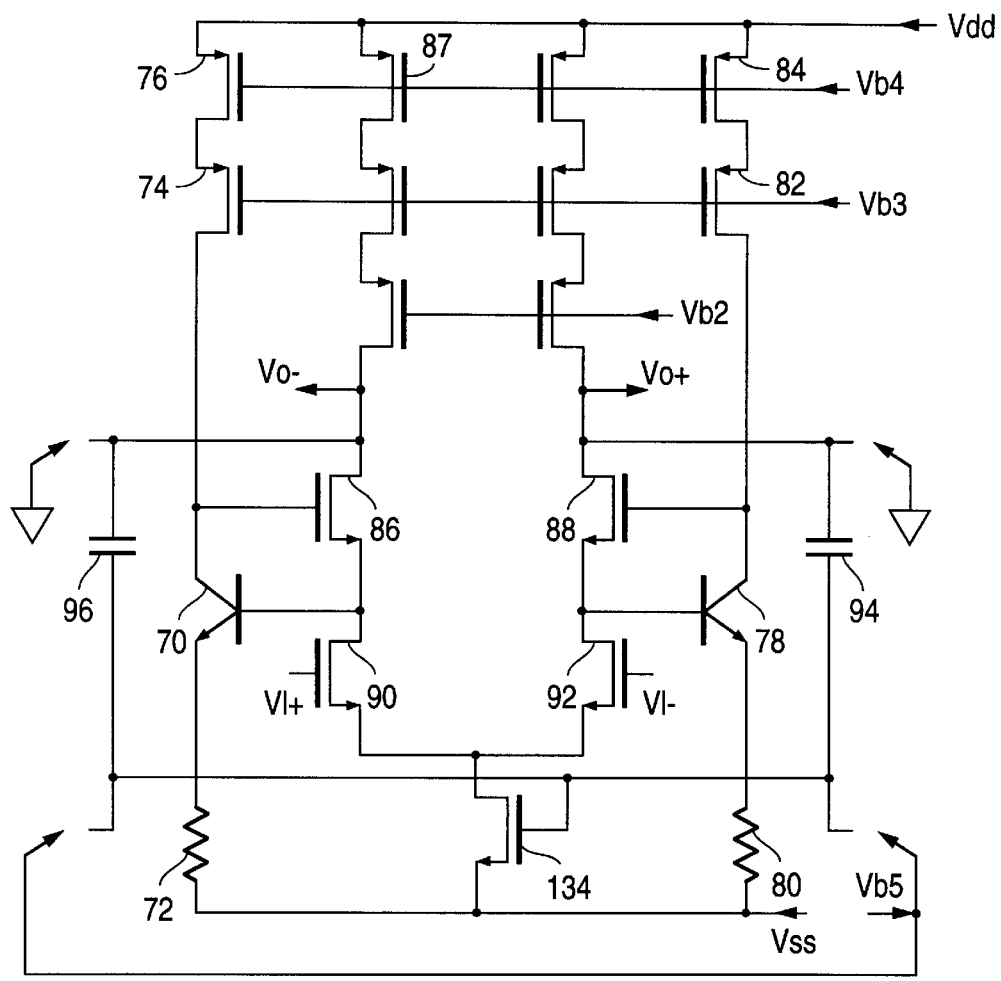
FIG. 7 depicts a prior art BiCMOS telescoped operational amplifier with low input Miller capacitance.
Figure 8:
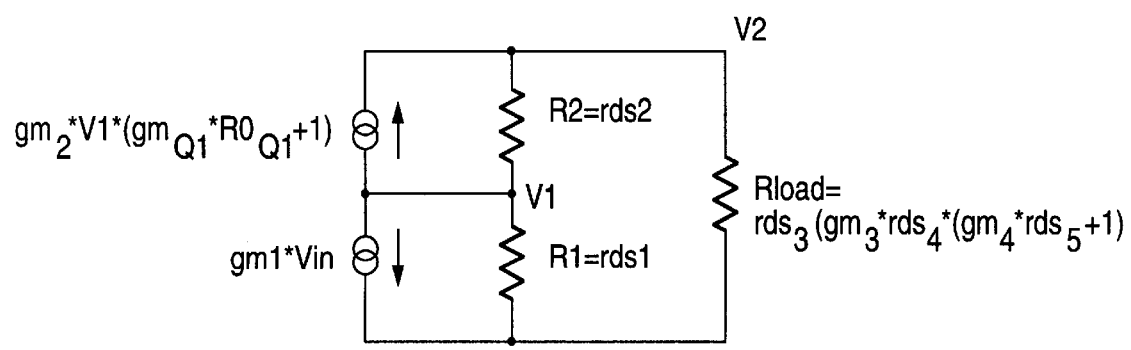
FIG. 8 depicts a small signal model for the prior art operational amplifier of FIG. 7.
Figure 9:
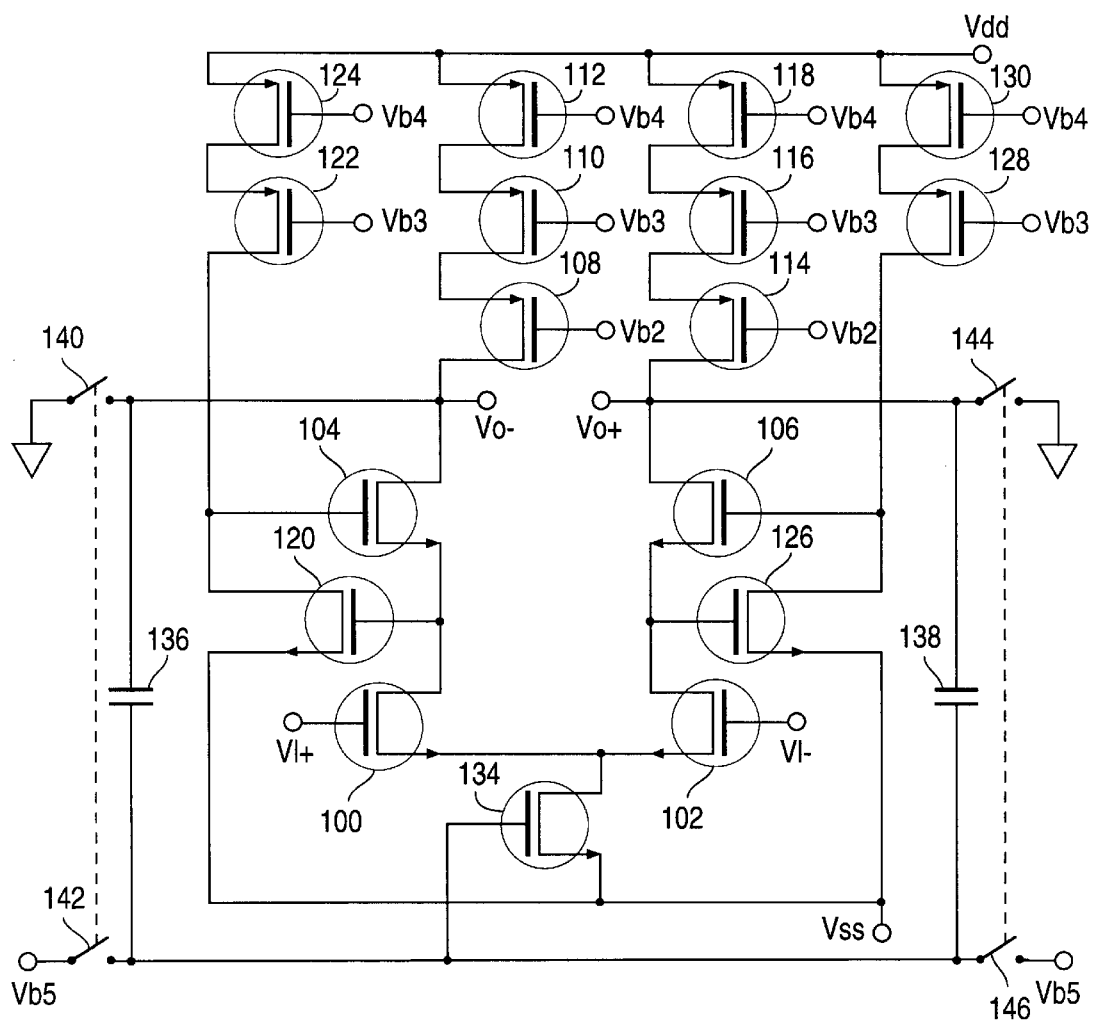
FIG. 9 depicts a prior art all CMOS telescoped operational amplifier with low input Miller capacitance.
Figure 10:
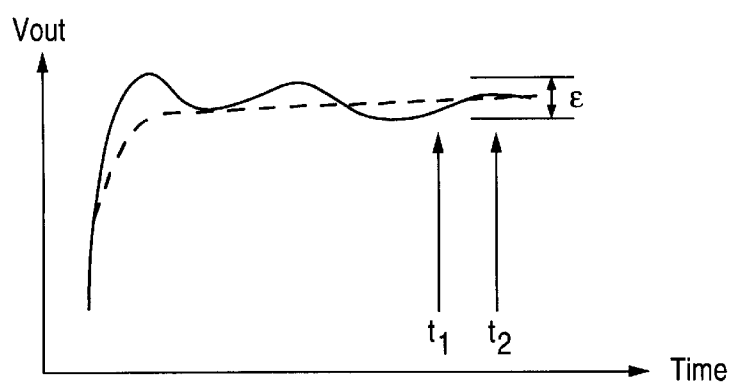
FIG. 10 depicts sampling degradation with respect to clock edges for a linearly settling and a non-linearly settling response.

The circuit described above modifies the operational amplifier circuits shown in FIGS. 7 and 9 by splitting the tail current transistor 134 into a number of devices and feeding forward a small fraction of the tail current, which also provides common mode feedback, directly to the sources of the cascode transistors 86 and 88 in FIG. 7, and the cascode transistors 104 and 106 in FIG. 9. This modification, as shown in FIG. 11, ensures that the cascode transistors, 204 and 206, are biased with enough current so that they will not turn off during transient slewing.

Still referring to FIG. 11, the operational amplifier of the first preferred embodiment of the present invention receives a differential input signal at the gate terminals of the input transistors 200 and 202 marked V1+ and V1− in FIG. 11. The input transistors 200 and 202 are cascoded by folded cascode transistors 204 and 206, respectively to provide both a higher output impedance and more gain. The three cascoded P-channel transistors 212, 210, and 208 on the negative output side and the three cascoded P-channel transistors 218, 216, and 214 on the positive output side of the operational amplifier serve as telescoped current sources to bias the output cascode transistors 204 and 206, respectively. In addition, the degenerated common-emitter amplifiers formed by transistors 224, 222, and 220 and resistor 221 on the negative output side and by transistors 230, 228, and 226 and resistor 227 on the positive output side of the operational amplifier are connected to provide active feedback to the folded cascode transistors 204 and 206, respectively. Both active feedback amplifiers 224, 222, 220, 221 and 230, 228, 226, 227 work to increase the operational amplifier's total voltage gain in the preferred embodiment by multiplying the transconductance by approximately fifty times.

Figure 1:
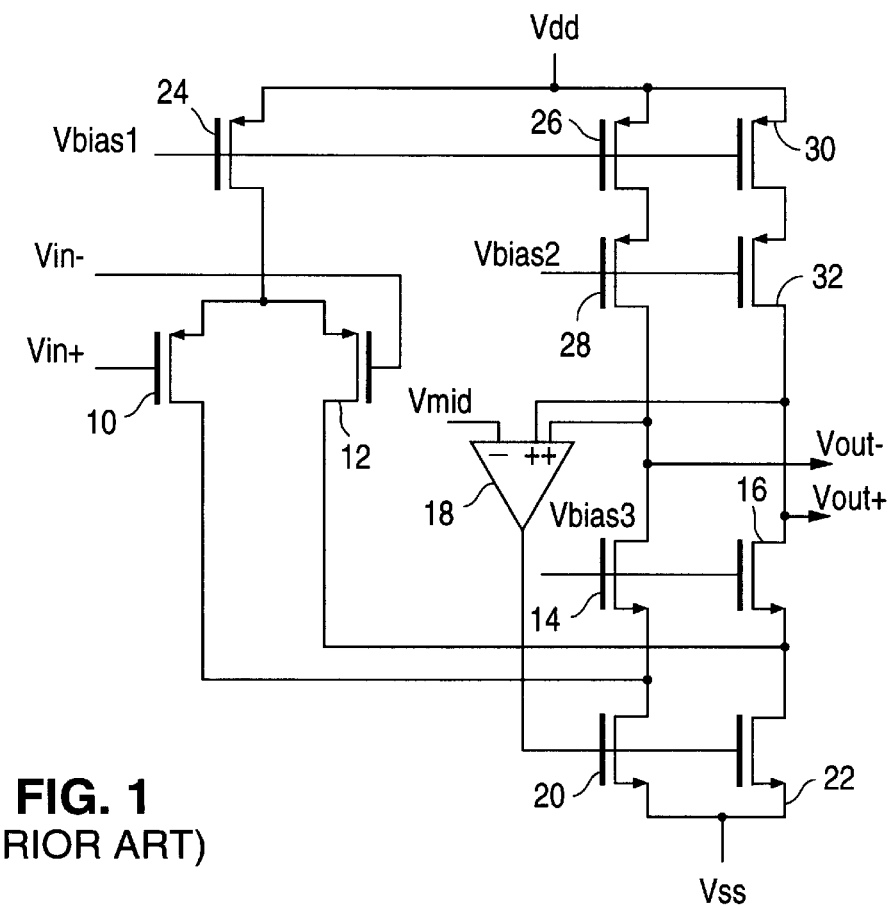
FIG. 1 depicts a typical folded cascode operational amplifier of the prior art.
Figure 2:
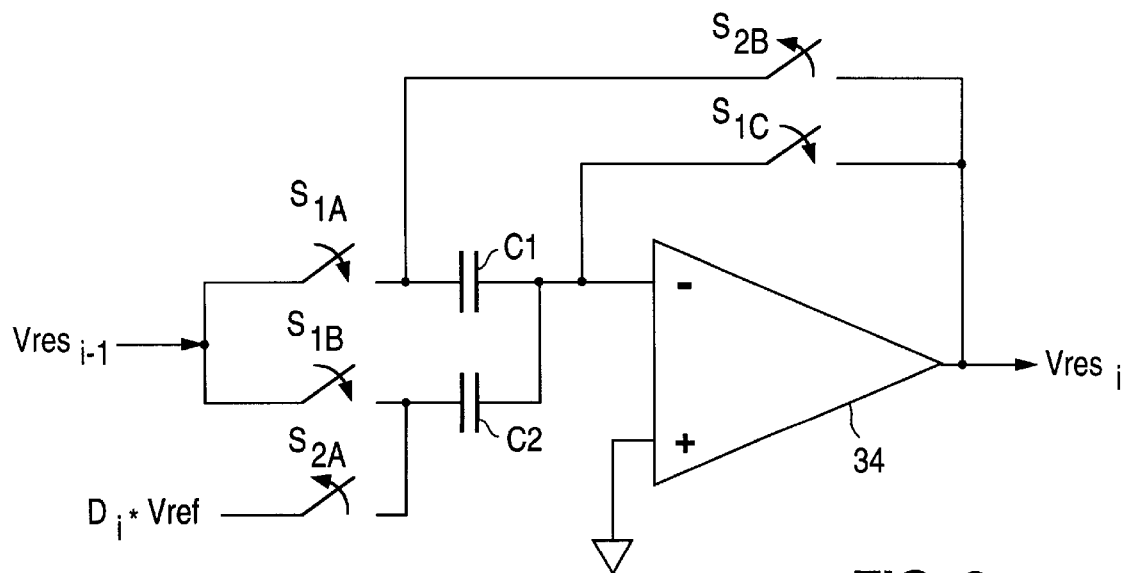
FIG. 2 depicts a prior art analog residue computation circuit for the prior art operational amplifier of FIG. 1.
Figure 3:
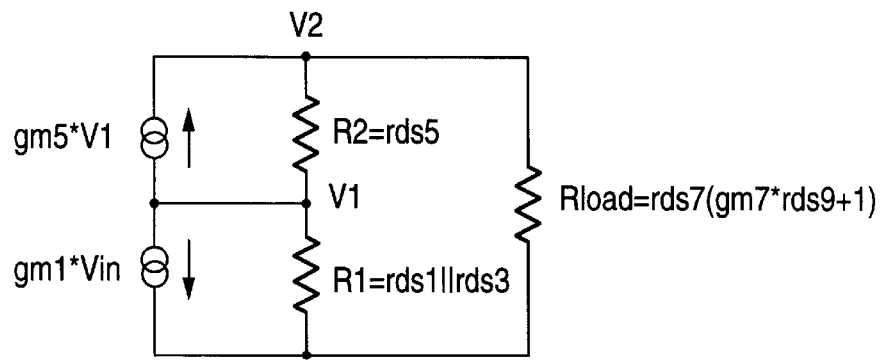
FIG. 3 depicts a small signal model for the typical folded cascode operational amplifier of FIG. 1.
Figure 4:
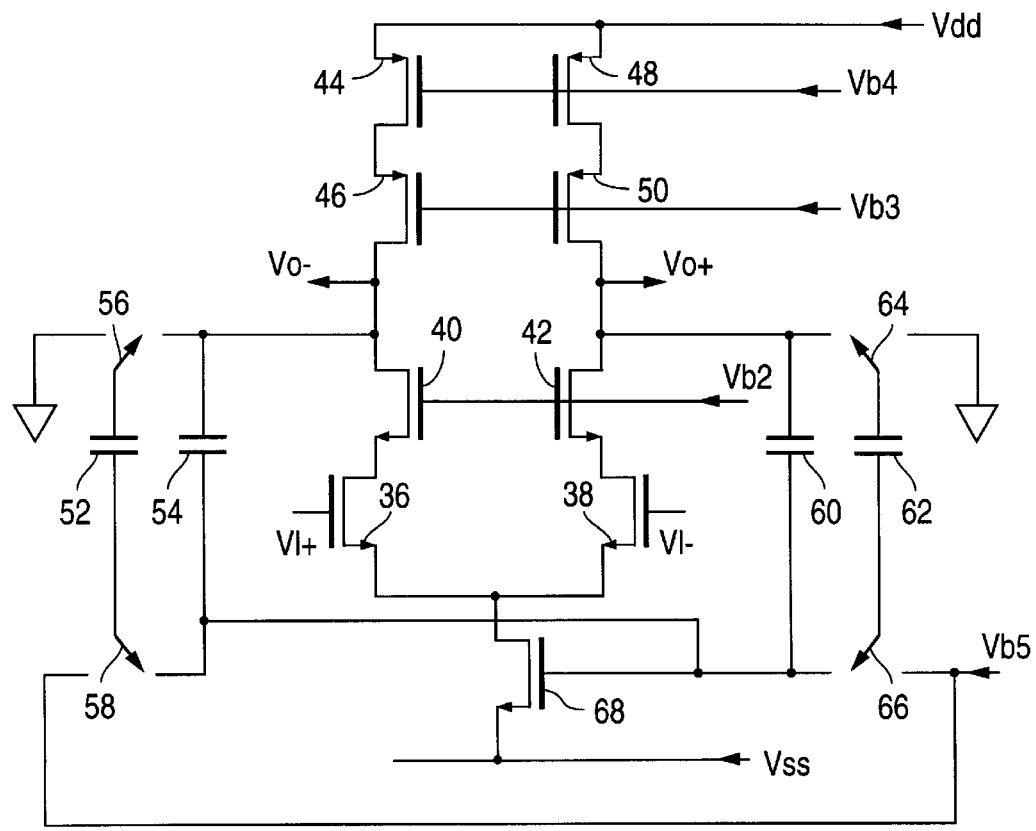
FIG. 4 depicts the prior art operational amplifier proposed by Nicollini et al.
Figure 5:
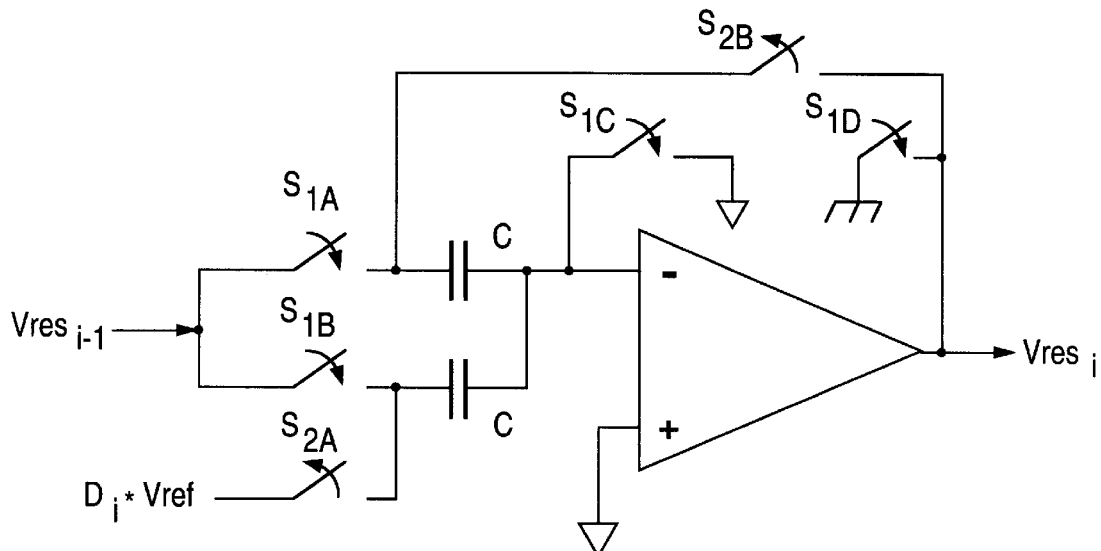
FIG. 5 depicts a prior art analog residue computation circuit modified for separate input and output common mode biasing of the prior art operational amplifier of FIG. 4.
Figure 6:
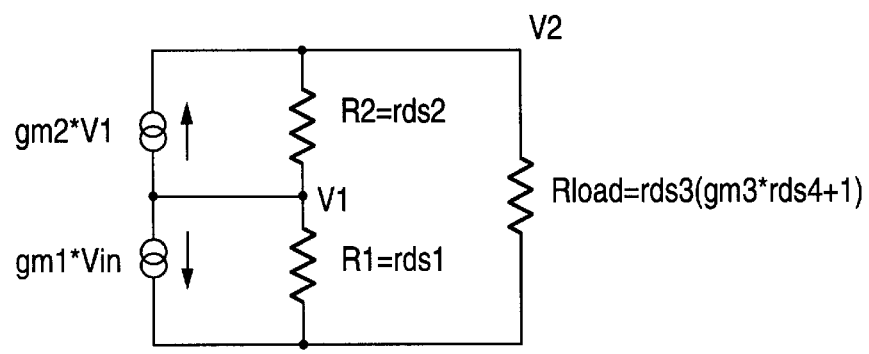
FIG. 6 depicts a small signal model for the prior art operational amplifier of FIG. 4.

The switched capacitor networks formed by capacitor 236 and switches 240 and 242 on the negative output side and capacitor 238 and switches 244 and 246 on the positive output side of the operational amplifier each provide common-mode biasing. The continuously connected capacitors 52 and 62 in the Nicollini et al. circuit of FIG. 4 are not required in the operational amplifier of the present invention and actually load the amplifier causing a speed degradation. This is because for a pipelined ADC application, the output is required to be active for only half of the clock period (referring to FIG. 2 and is FIG. 5, the output is sampled by the next stage when the switches labeled $S_1$ are open and the switches labeled $S_2$ are closed.) In the first embodiment of the present invention, only two capacitors 236 and 238 are needed. These capacitors 236 and 238 are connected to the gate of the tail transistor 234 directly without a switch which would have resistance that would slow the common-mode feedback.

Ringing and overshoot of the differential output signals generated at nodes Vo− and Vo+ is caused when one of the cascode transistors, 204 or 206, is turned off completely during slewing. During slewing, one of the input transistors, 200 or 202, is turned off (depending on whether positive or negative slewing is occurring) and subsequently the corresponding folded cascode transistor, 204 or 206, in series with that input transistor, 200 or 202, is also turned off. During the time period that the cascode device, 204 or 206, is turned off, the amplifier is effectively running open loop. While the open loop operating condition exists, the output of the amplifier is no longer under control of the negative feedback loop and it will overshoot until the bias provided by the respective current sources 212, 210, 208 or 218, 216, 214 for the cascode devices 204 and 206 recovers and negative feedback is reapplied.

During the short period of time that the amplifier is running open loop, the circuit effectively acts as a relaxation oscillator and will subsequently exhibit transient instability until the operational amplifier loop gain is re-established and negative feedback is reapplied to the circuit. This problem is solved in the present invention by the keep-alive circuit formed by the tail current transistor 234 and the two keep-alive transistors 248 and 250. Keep-alive transistors 248 and 250 feed forward a small fraction of the tail current around the differential pair 200 and 202 to the sources of the folded cascode transistors 204 and 206 that would otherwise flow through the tail current transistor 234. The fraction of the tail current fed forward to the cascodes 204 and 206 also provides common mode feedback. The cascode transistors 204 and 206 are "kept-alive" or biased by the keep-alive transistors 248 and 250 with enough current so that they will not turn off during transient slewing. The preferred fraction of tail current for to eliminating overshoot and reducing settling time is discussed below.

Figure 12:
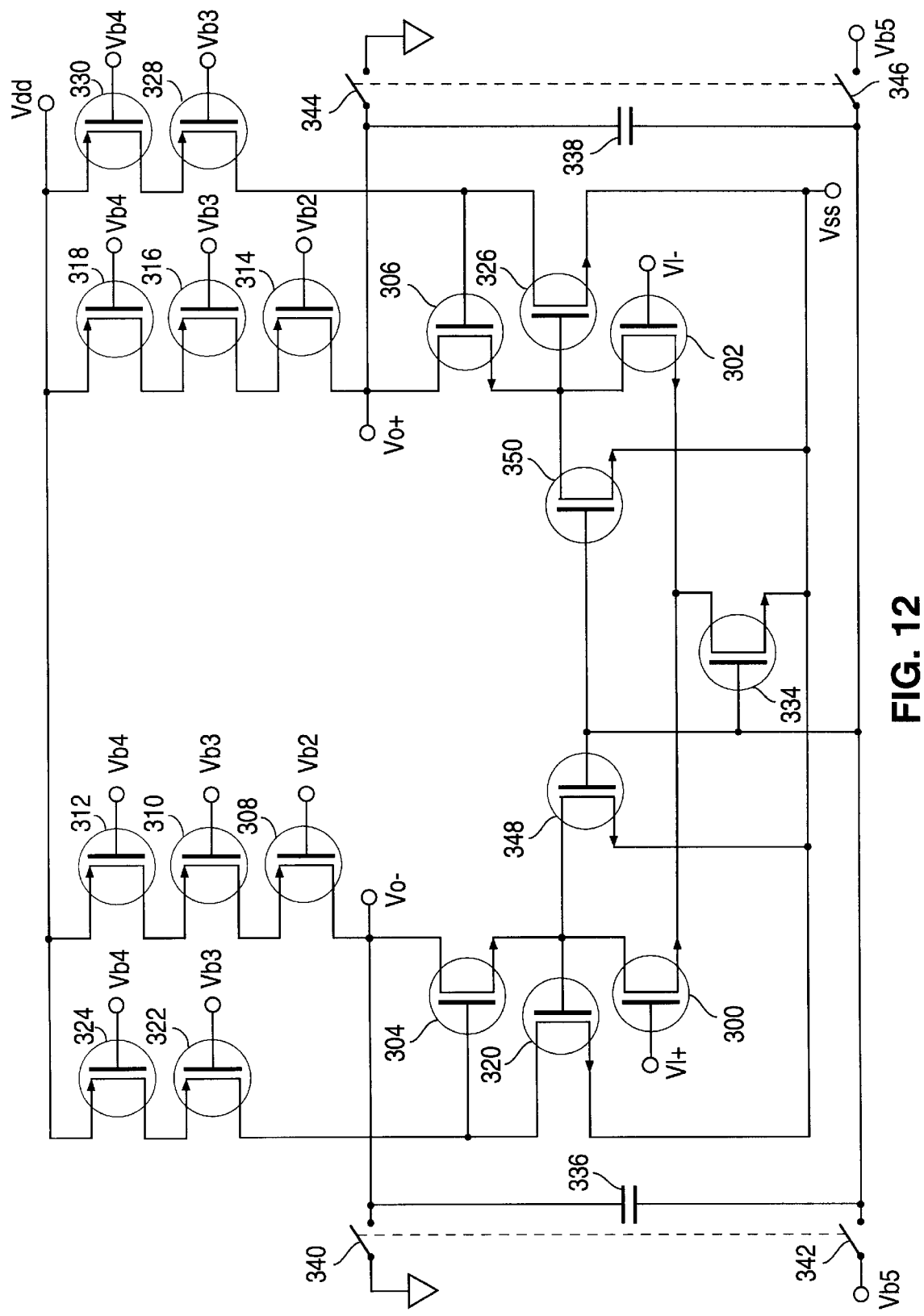
FIG. 12 depicts an all CMOS operational amplifier, with low input Miller capacitance and low overshoot transient response, according to the present invention.
Figure 13:
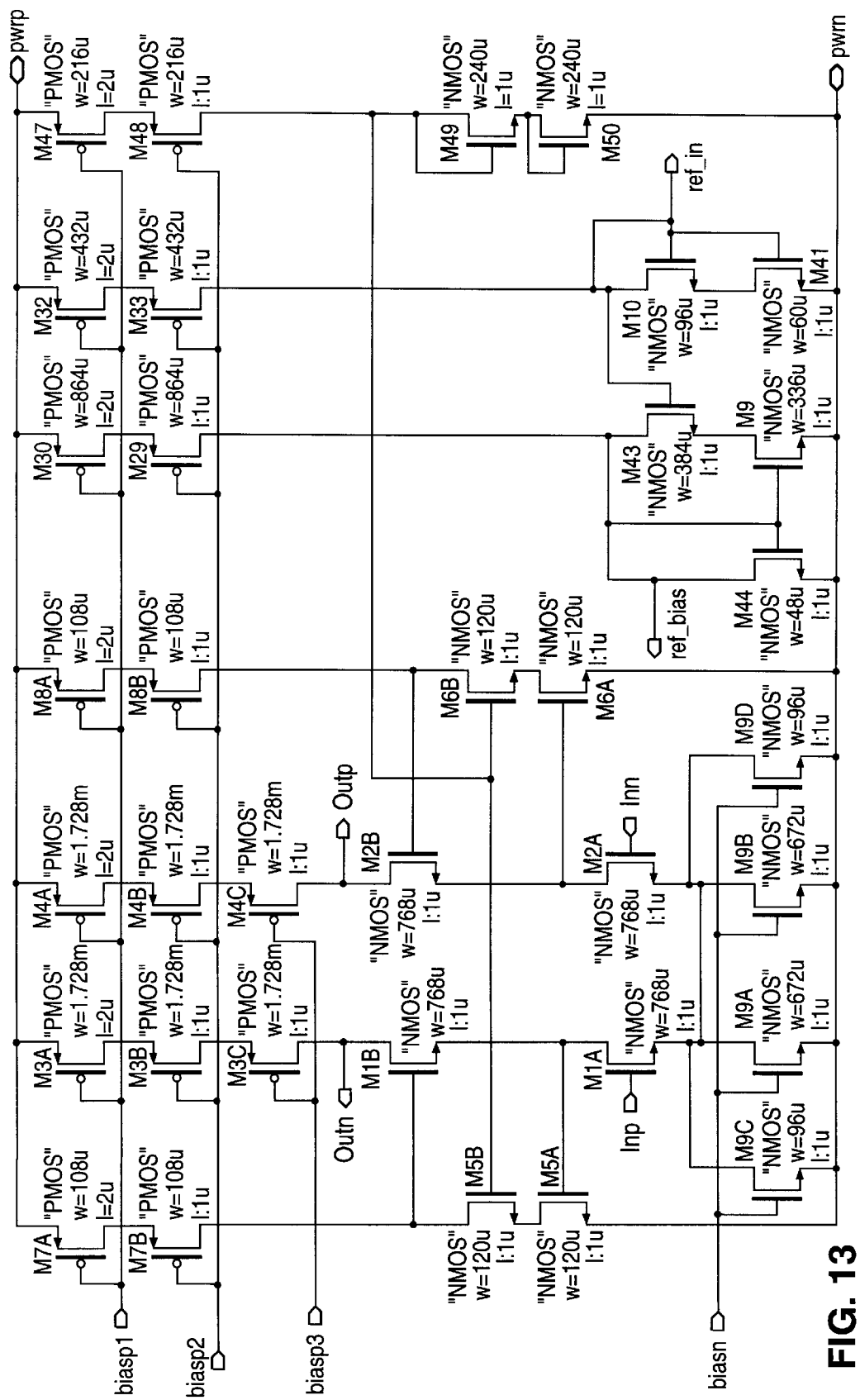
FIG. 13 depicts a detail diagram of a prior art operational amplifier 4× cell showing only the active cascodes.
Figure 14:
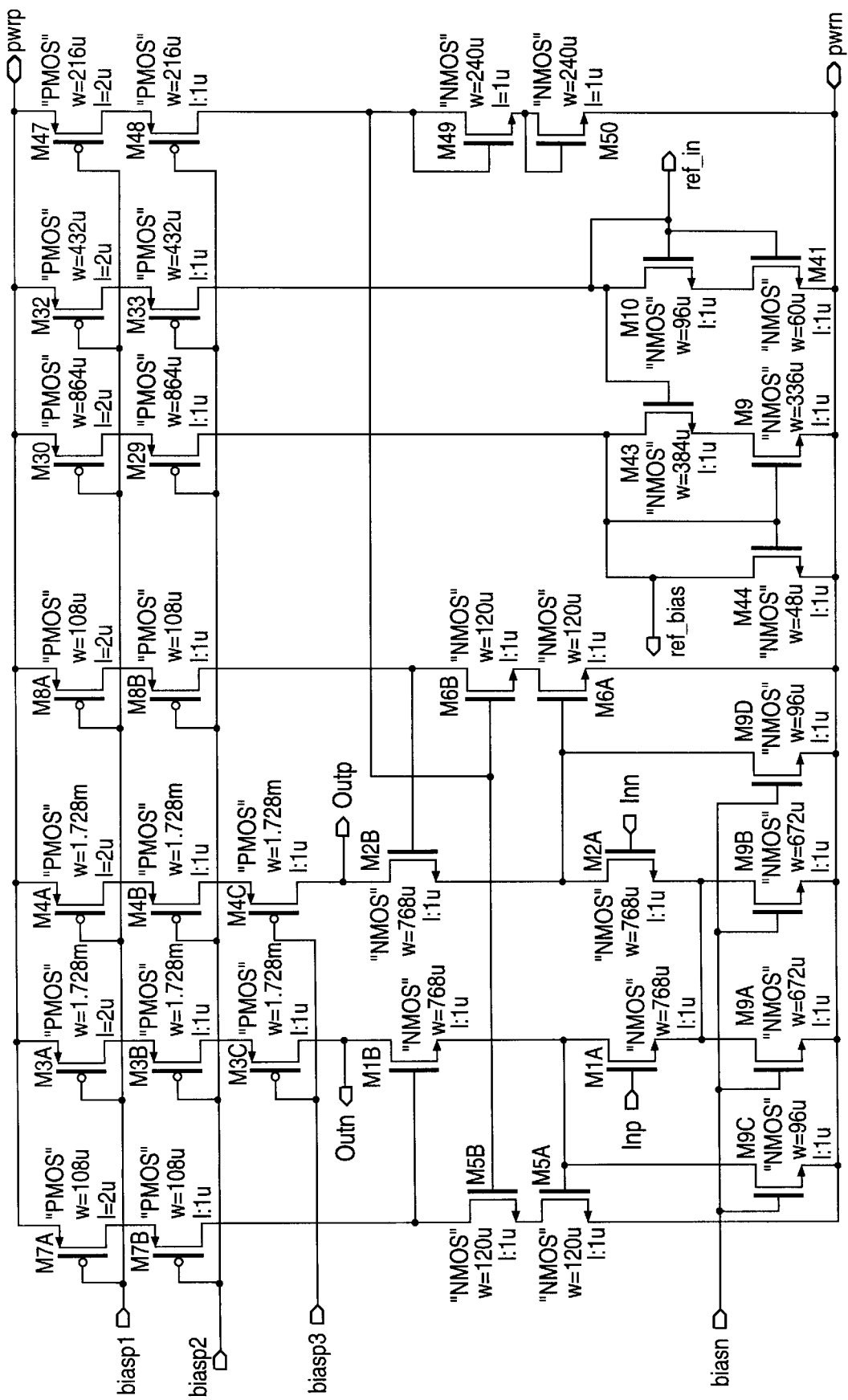
FIG. 14 depicts a detail of the operational amplifier 4× cell showing active cascodes and feedforward of tail current to improve transient response according to the present invention.

Turning now to FIG. 12, an all CMOS embodiment of the operational amplifier of the present invention will be described in detail. The gates of transistors 300 and 302 are the differential pair inputs. The sources of transistors 300 and 302 are connected to each other and they feed the drain of the tail current transistor 334. The source of the tail current transistor 334 is connected to ground. The gate of the tail current transistor 334 is connected to a node which also connects two switched capacitor networks 336, 340, 336 and 338, 344, 346 as well as the gates of keep-alive transistors 348 and 350. The sources of keep-alive transistors 348 and 350 are connected to ground while the drains are connected to the sources of cascode transistors 304 and 306, respectively. The sources of cascode transistors 304 and 306 are connected to the drains of the input transistors 300 and 302, respectively. The drains of the cascode transistors 304 and 306 are the output nodes of the operational amplifier. Also connected to the output nodes are the telescoped current sources formed by three cascoded P-channel transistors 308, 310, 312 on the negative output side of the circuit and three cascoded P-channel transistors 314, 316, 318 on the positive output side of the circuit.

This second preferred embodiment of the present invention includes amplifiers formed by amplifier transistor 320 together with transistors 322 and 324 on one side of the circuit and by amplifier transistor 326 together with transistors 328 and 330 on the other side. The gates of the amplifier transistors 320 and 326 are connected to the sources of the cascode transistors 304 and 306, respectively and the drains of the amplifier transistors 320 and 326 are connected to the gates of the cascode transistors 204 and 206, respectively. Functionally, the operational amplifier of the second preferred embodiment depicted in FIG. 12 operates in the same manner as the first preferred embodiment depicted in FIG. 11, the only difference being in the type of transistors used in the active feedback amplifiers. The BiCMOS operational amplifier of the first preferred embodiment of FIG. 11 uses NPN bipolar transistors 220 and 226 while the CMOS-only operational amplifier of the second preferred embodiment uses N-channel MOSFETs 320 and 326.

Figure 15:
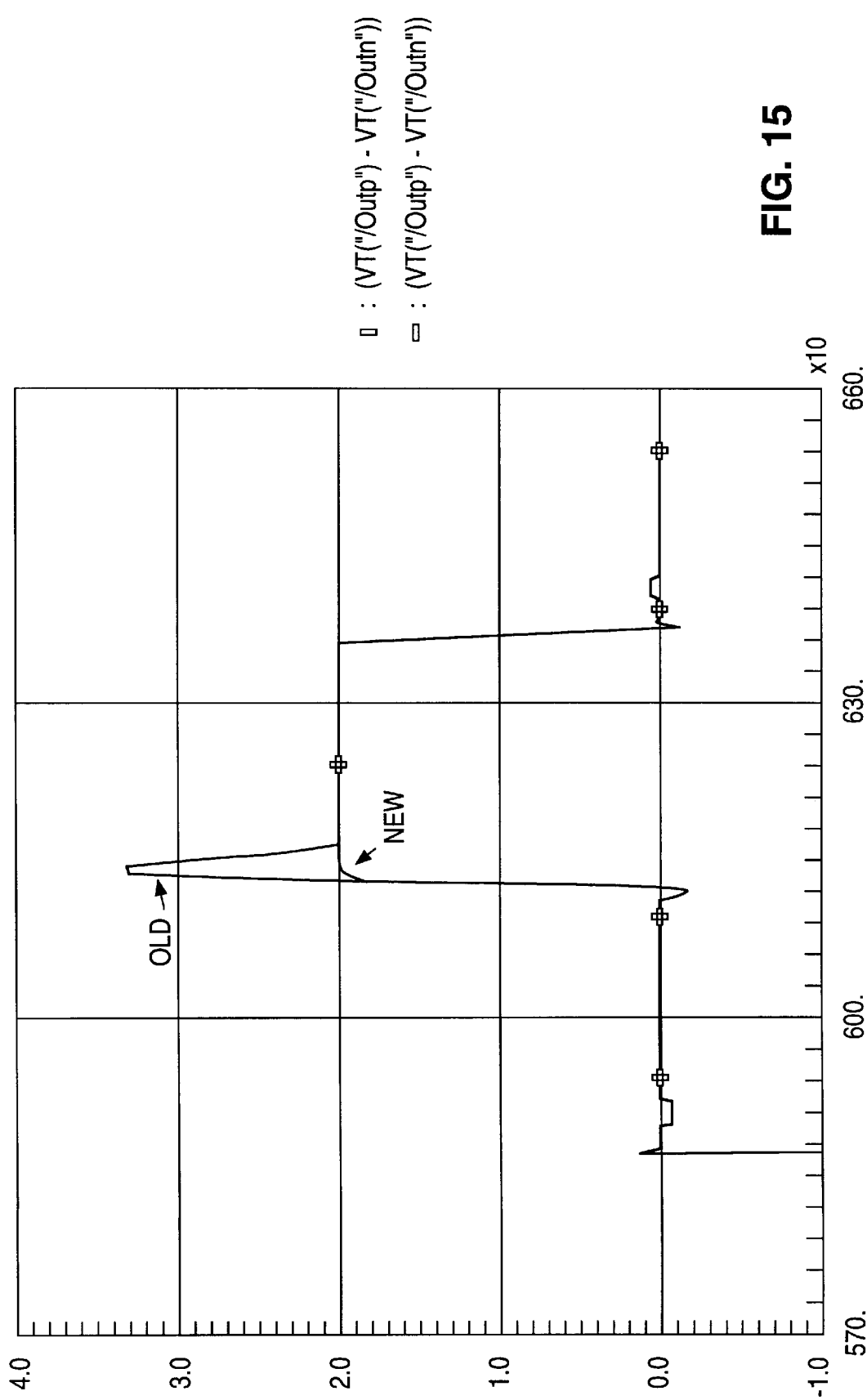
FIG. 15 depicts the differential settling response of the operational amplifier 4× cell of FIG. 14 showing reduction of overshoot from 62% to 0% according to the present invention.
Figure 16:
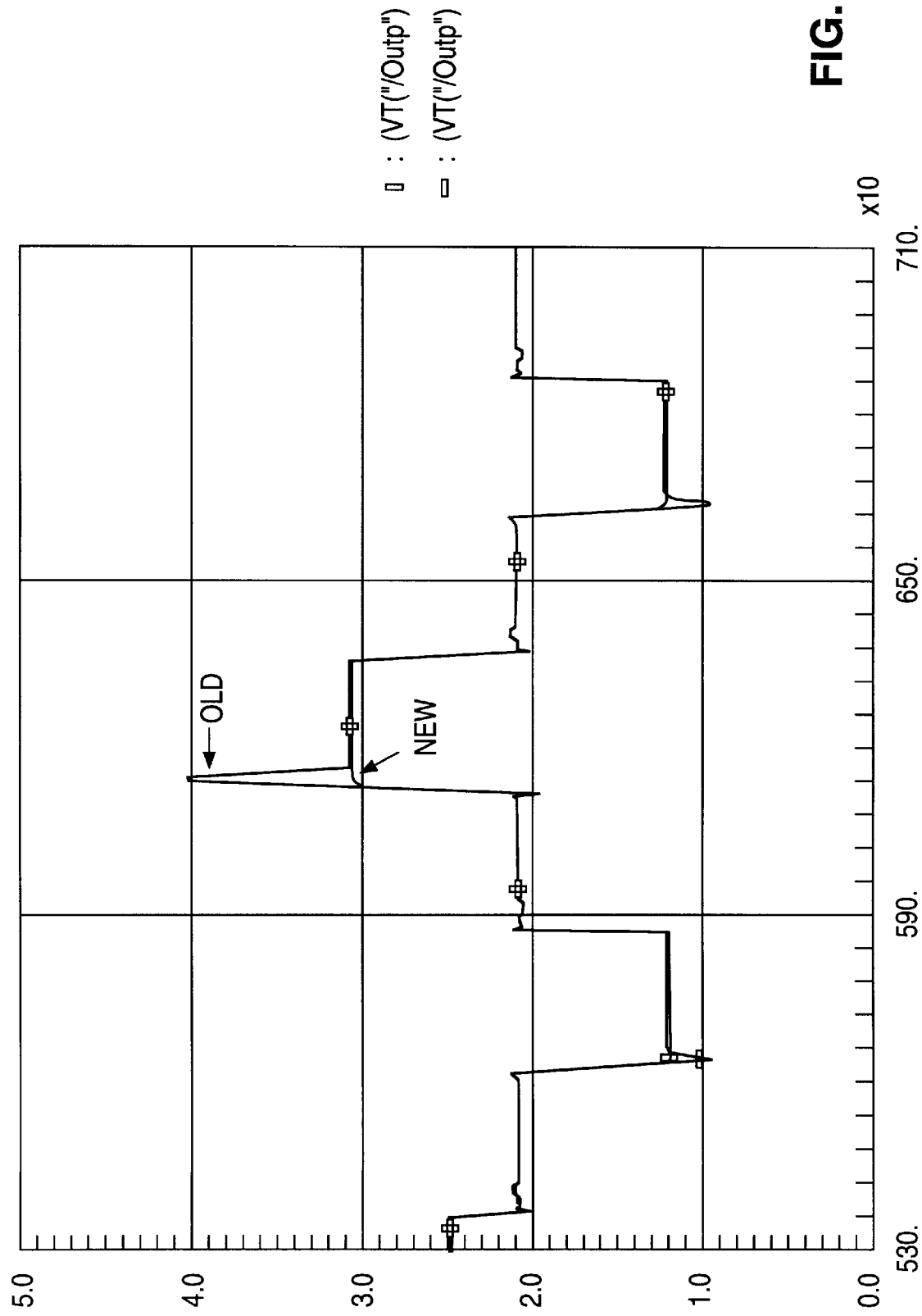
FIG. 16 depicts the single ended settling response of the operational amplifier 4× cell of FIG. 14 showing reduction of overshoot on positive going output from 90% to 0% according to the present invention.
Figure 17:
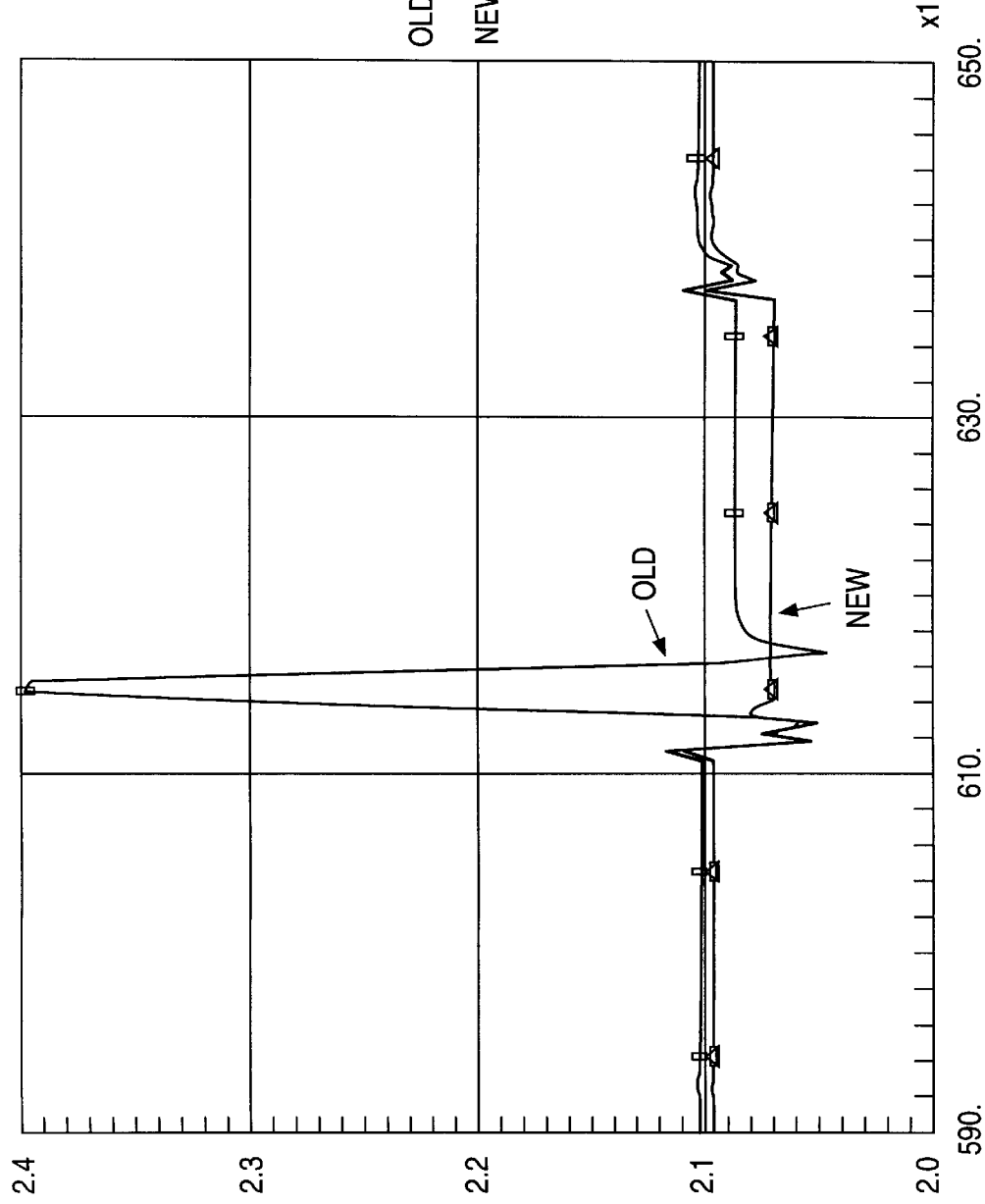
FIG. 17 depicts the common mode response of the operational amplifier 4× cell of FIG. 14 showing reduction of transient ringing from 200mV to 10mV according to the present invention.
Figure 18:
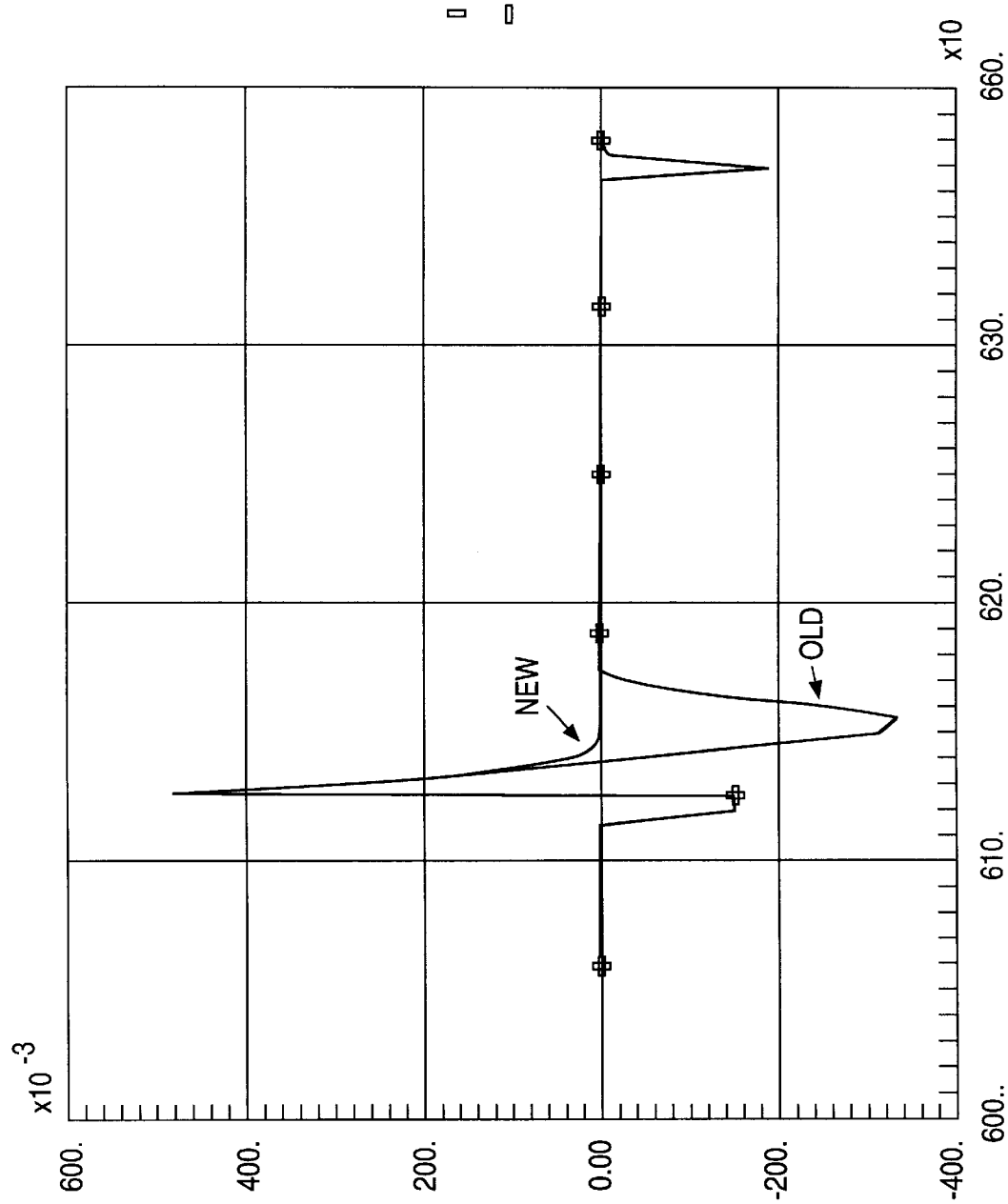
FIG. 18 depicts the differential input response of the operational amplifier 4× cell of FIG. 14 showing reduction of negative going transient overshoot from 320mV to 0 with the cascode biasing technique according to the present invention.

Empirically, it has been found that splitting the tail current transistor 234/334 into 16 "pieces" and feeding 14/16 of the nominal tail current to the coupled sources of the input transistors 200/300 and 202/302 and 1/16 of the nominal tail current to the sources of each of the cascode devices 204/304 and 206/306 provided the best mode of operation. In other words, a conductivity ratio between the tail current transistor 234/334 and each of the keep-alive transistors 248/348 and 250/350 of fourteen to one provided the shortest settling time. However, it should be noted that different ratios might be more suitable for different applications. As seen in FIG. 15, use of the keep-alive cascode biasing technique implemented with this ratio results in the overshoot being reduced from 62% to 0%, which is a critically damped response. The final settling time is improved as seen in FIG. 17. An essential aspect of this invention is that these results are obtained without using any additional power over that required by the prior art operational amplifiers.

Various other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a differential amplifier with reduced switched output signal settling time, comprising:

a cascode differential amplifier configured to receive first and second input bias currents and a differential input signal and in accordance therewith provide first, second and third output bias currents and a differential output signal, wherein a sum of said first and second input bias currents equals a sum of said first, second and third output bias currents, and wherein said cascode differential amplifier comprises a first cascode amplifier which includes a first input transistor configured to receive a first phase of said differential input signal and provide a first portion of said third output bias current and which further includes a first output transistor cascode coupled to said first input transistor and configured to receive said first input bias current and provide said first output bias current and a first phase of said differential output signal, and a second cascode amplifier which includes a second input transistor configured to receive a second phase of said differential input signal and provide a second portion of said third output bias current and which further includes a second output transistor cascode coupled to said second input transistor and configured to receive said second input bias current and provide said second output bias current and a second phase of said differential output signal;

a first bias transistor, coupled to said first output transistor, configured to receive and conduct said first output bias current;

a second bias transistor, coupled to said second output transistor, configured to receive and conduct said second output bias current; and a third bias transistor, coupled to said first and second input transistors, configured to receive and conduct said third output bias current;

wherein said first and second portions of said third output bias current vary between zero and respective first and second maximum currents in accordance with said first and second phases of said differential input signal, and wherein said first and second output bias currents are respective first and second nonzero currents.

2. The apparatus of claim 1, wherein said cascode differential amplifier further comprises:
   a first feedback transistor, coupled to said first bias transistor and said first input and output transistors, configured to provide active feedback to said first output transistor; and
   a second feedback transistor, coupled to said second bias transistor and said second input and output transistors, configured to provide active feedback to said second output transistor.

3. The apparatus of claim 2, wherein each one of said first and second cascode amplifiers comprises a BiCMOS amplifier.

4. The apparatus of claim 1, further comprising:
   a first bias current source, coupled to said first cascode amplifier, configured to provide said first input bias current; and
   a second bias current source, coupled to said second cascode amplifier, configured to provide said second input bias current.

5. The apparatus of claim 1, further comprising:
   a first capacitor, coupled between said first output transistor and said first bias transistor, configured to bias said first bias transistor by capacitively coupling thereto said first phase of said differential output signal; and
   a second capacitor, coupled between said second output transistor and said second bias transistor, configured to bias said second bias transistor by capacitively coupling thereto said second phase of said differential output signal.

6. The apparatus of claim 1, further comprising first and second capacitors, coupled from said first and second output transistors to said first, second and third bias transistors, configured to bias said first, second and third bias transistors by capacitively coupling thereto said first and second phases of said differential output signal.

7. An operational amplifier comprising:
   a pair of differential input transistors each having a source, a gate and a drain, the pair connected together at the sources;
   a pair of cascode transistors each having a source, a gate and a drain, individually connected to the input transistors so as to form a cascode; and
   a keep-alive circuit, including a switched capacitor common-mode feedback network, connected to provide current to the sources of the cascode transistors.

8. The operational amplifier of claim 7, wherein the keep-alive circuit comprises:
   a tail current transistor having a source, a gate and a drain, connected between the sources of the input transistors and ground; and
   a pair of keep-alive transistors each having a source, a gate and a drain, connected to the sources of the cascode transistors to provide a bias current.

9. An operational amplifier comprising:
   a pair of differential input transistors each having a source, a gate and a drain, the pair connected together at the sources;
   a pair of cascode transistors each having a source, a gate and a drain, individually connected to the input transistors so as to form a cascode;
   a keep-alive circuit connected to provide current to the sources of the cascode transistors; and
   a pair of amplifiers operatively connected to provide active feedback to the cascode transistors.

10. The operational amplifier of claim 9, wherein the pair of amplifiers comprises a pair of BiCMOS amplifiers.

11. The operational amplifier of claim 9, wherein the pair of amplifiers comprises a pair of CMOS-only amplifiers.

12. The operational amplifier of claim 9, further comprising:
    a pair of switched capacitor networks operatively connected to the pair of cascode transistors to provide common-mode bias; and
    a pair of current sources operatively connected to the pair of cascode transistors to bias the operational amplifier.

13. The operational amplifier of claim 12, wherein each one of the pair of current sources comprises a plurality of cascoded P-channel current sources.

14. A differential operational amplifier comprising:
    a first input transistor having a source, a gate and a drain;
    a second input transistor having a source, a gate and a drain, connected via the source to the source of the first input transistor;
    a first cascode transistor having a source, a gate and a drain, connected via the source to the drain of the first input transistor;
    a second cascode transistor having a source, a gate and a drain, connected via the source to the drain of the second input transistor;
    a tail current transistor connected between the connected sources of the first and second input transistors and ground;
    a first keep-alive transistor having a source, a gate and a drain, connected via the drain to the source of the first cascode transistor to provide a bias current and capacitively coupled via the gate to the source of the first cascode transistor so as to provide common mode feedback; and
    a second keep-alive transistor having a source, a gate and a drain, connected via the drain to the source of the second cascode transistor to provide a bias current and capacitively coupled via the gate to the source of the second cascode transistor so as to provide common mode feedback.

15. A differential operational amplifier comprising:
    a first input transistor having a source, a gate and a drain;
    a second input transistor having a source, a gate and a drain, connected via the source to the source of the first input transistor, a first cascode transistor having a source, a gate and a drain, connected via the source to the drain of the first input transistor;
    a second cascode transistor having a source, a gate and a drain, connected via the source to the drain of the second input transistor;
    a tail current transistor connected between the connected sources of the first and second input transistors and ground;
    a first keep-alive transistor having a source, a gate and a drain, connected via the drain to the source of the first cascode transistor to provide a bias current;
    a second keep-alive transistor having a source, a gate and a drain, connected via the drain to the source of the second cascode transistor to provide a bias current;
    a first amplifier operatively connected to provide active feedback to the first cascode transistor; and
    a second amplifier operatively connected to provide active feedback to the second cascode transistor.

16. The operational amplifier of claim 15, wherein each of the first and second amplifiers comprise a BiCMOS amplifier.

17. The operational amplifier of claim 15, wherein each of the first and second amplifiers comprise a CMOS-only amplifier.

18. A differential operational amplifier comprising:

a first input transistor having a source, a gate and a drain;

a second input transistor having a source, a gate and a drain, connected via the source to the source of the first input transistor;

a first cascode transistor having a source, a gate and a drain, connected via the source to the drain of the first input transistor:

a second cascode transistor having a source, a gate and a drain, connected via the source to the drain of the second input transistor;

a tail current transistor connected between the connected sources of the first and second input transistors and ground:

a first keep-alive transistor having a source, a gate and a drain, connected via the drain to the source of the first cascode transistor to provide a bias current;

a second keep-alive transistor having a source, a gate and a drain, connected via the drain to the source of the second cascode transistor to provide a bias current;

a first switched capacitor network operatively connected to the first cascode transistor to provide common-mode bias;

a second switched capacitor network operatively connected to the second cascode transistor to provide common-mode bias;

a first current source operatively connected to the first cascode transistor to bias the operational amplifier; and a second current source operatively connected to the second cascode transistor to bias the operational amplifier.

19. The operational amplifier of claim 18, wherein each one of the first and second current sources comprises a plurality of cascoded P-channel current sources.

20. The operational amplifier of claim 14, wherein the first keep-alive transistor, the second keep-alive transistor, and the tail current transistor each have a conductance wherein the ratio of the conductance of the first keep-alive transistor to that of the tail current transistor is approximately equal to the ratio of the conductance of the second keep-alive transistor to that of the tail current transistor.

21. The operational amplifier of claim 20, wherein the ratio of the conductance of either of the keep-alive transistors to that of the tail current transistor is approximately equal to 1:14.

22. The operational amplifier of claim 14, wherein the first keep-alive transistor, the second keep-alive transistor, and the tail current transistor each have a channel width wherein the ratio of the channel width of the first keep-alive transistor to that of the tail current transistor is approximately equal to the ratio of the channel width of the second keep-alive transistor to that of the tail current transistor.

23. The operational amplifier of claim 22, wherein the ratio of the channel width of either of the keep-alive transistors to that of the tail current transistor is approximately equal to 1:14.

24. An operational amplifier having an output signal, the operational amplifier comprising:

an input stage;

a gain stage connected to the input stage;

an output stage connected to the gain stage;

a switched capacitor common mode feedback network; and a keep-alive circuit connected between the input stage and the output stage wherein the keep-alive circuit generates a keep alive current by connecting to the switched capacitor common mode feedback network.

25. The operational amplifier of claim 24, wherein the keep-alive circuit comprises:

a first keep-alive transistor;

a second keep-alive transistor; and a tail current transistor, each transistor having a channel width, wherein the ratio of the channel width of the first keep-alive transistor to that of the tail current transistor is equal to the ratio of the channel width of the second keep-alive transistor to that of the tail current transistor.

26. The operational amplifier of claim 25, wherein the ratio of the channel width of either of the keep-alive transistors to that of the tail current transistor is equal to 1:14.

27. A method of differentially amplifying a switching signal with reduced switched output signal settling time, comprising the steps of:

receiving and differentially amplifying in a cascode manner first and second input bias currents and a differential input signal and in accordance therewith generating first, second and third output bias currents and a differential output signal, wherein a sum of said first and second input bias currents equals a sum of said first, second and third output bias currents, by performing the steps of receiving a first phase of said differential input signal and in accordance therewith generating a first portion of said third output bias current, receiving said first input bias current and in accordance therewith generating, in a cascode manner with respect to said first phase of said differential input signal, said first output bias current and a first phase of said differential output signal, and receiving a second phase of said differential input signal and in accordance therewith generating a second portion of said third output bias current, receiving said second input bias current and in accordance therewith generating, in a cascode manner with respect to said second phase of said differential input signal, said second output bias current and a second phase of said differential output signal;

receiving and conducting said first output bias current; receiving and conducting said second output bias current; and receiving and conducting said third output bias current;

wherein said first and second portions of said third output bias current vary between zero and respective first and second maximum currents in accordance with said first and second phases of said differential input signal, and wherein said first and second output bias currents are respective first and second nonzero currents.

28. The method of claim 27, wherein said said step of receiving and differentially amplifying in a cascode manner first and second input bias currents and a differential input signal and in accordance therewith generating first, second and third output bias currents and a differential output signal further comprises:

generating a first active feedback signal in accordance with said first output bias current; and generating a second active feedback signal in accordance with said second output bias current.

29. The method of claim 27, further comprising the steps of:

capacitively coupling said first phase of said differential output signal during said step of receiving and conducting said first output bias current; and capacitively coupling said second phase of said differential output signal during said step of receiving and conducting said second output bias current.

30. The method of claim 27, further comprising the step of capacitively coupling said first and second phases of said differential output signal during said steps of:

receiving and conducting said first output bias current;

receiving and conducting said second output bias current; and receiving and conducting said third output bias current.

31. An operational amplifier comprising:

a pair of differential input transistors each having a source, a gate and a drain, the pair connected together at the sources;

a pair of cascode devices each having a source, a gate and a drain, individually connected to the input transistors so as to form a cascode; and a keep-alive circuit connected to provide current to the sources of the cascode transistors.

wherein the keep-alive circuit provides keep-alive current from a pair of transistors, each having a source, a gate and a drain connected between the sources of the cascode devices and ground with the gates connected on alternate clock phases to a replica bias network and a pair of capacitors connected so as to provide common mode feedback.

* * * * *

UNITED STATES PATENT AND TRADEMARK OFFICE
CERTIFICATE OF CORRECTION

PATENT NO.: 5,847,607
DATED: December 8, 1998
INVENTOR(S): Laurence D. Lewicki et al.

It is certified that errors appear in the above-identified patent and that said Letters Patent is hereby corrected as shown below:

In Col. 14, lines 48-50, delete ", a first cascode transistor having a source, a gate and a drain, connected via the source to the drain of the first input transistor;" and replace with --;
    a first cascode transistor having a source, a gate and a drain, connected via the source to the drain of the first input transistor;--.

In Col. 15, line 14, delete ":" and replace with --;--.

In Col. 15, line 21, delete ":" and replace with --;--.

In Col. 16, line 60, delete the first occurence of "said".

In Col. 18, line 9, delete "." and replace with --;--.

Signed and Sealed this

Twenty-third Day of March, 1999

Attest:

Q. TODD DICKINSON

*Attesting Officer*     *Acting Commissioner of Patents and Trademarks*